United States Patent [19]

Fensch

[11] Patent Number: 5,420,526
[45] Date of Patent: May 30, 1995

[54] CIRCUIT FOR PULLING AN INTEGRATED CIRCUIT INPUT TO A DETERMINED STATE

[75] Inventor: Thierry Fensch, Grenoble, France

[73] Assignee: SGS-Thomson Microelectronics S.A., Gentilly, France

[21] Appl. No.: 106,042

[22] Filed: Aug. 12, 1993

[30] Foreign Application Priority Data

Aug. 12, 1992 [FR] France .................. 92 10140

[51] Int. Cl.⁶ .................. H03K 17/16; H03K 5/08
[52] U.S. Cl. .................. 326/30; 327/331; 327/321
[58] Field of Search ........... 307/443, 544, 548, 550, 307/568; 326/30; 327/331, 321

[56] References Cited

U.S. PATENT DOCUMENTS

| T 952,012 | 11/1976 | Lee . | |
|---|---|---|---|
| 3,774,053 | 11/1973 | Carlson | 307/550 |
| 3,819,952 | 6/1974 | Enomoto et al. | 307/550 |
| 3,946,251 | 3/1976 | Kawagoe | 307/550 |
| 4,498,021 | 2/1985 | Uya . | |
| 4,596,936 | 6/1986 | Aoyama . | |
| 4,647,797 | 3/1987 | Sanwo et al. . | |
| 4,958,093 | 9/1990 | Kosson et al. | 307/548 |
| 5,095,229 | 3/1992 | Yun et al. | 307/443 |
| 5,168,181 | 12/1992 | Baiocchi et al. | 307/548 |
| 5,216,292 | 6/1993 | Imazu et al. | 307/443 |
| 5,218,242 | 6/1993 | Imazu et al. | 307/548 |

Primary Examiner—David R. Hudspeth
Assistant Examiner—Richard Roseen
Attorney, Agent, or Firm—Wolf, Greenfield & Sacks

[57] ABSTRACT

A circuit pulls up an integrated circuit input capable of receiving a low voltage, receiving a high voltage, or floating. The circuit includes a first MOS transistor connected between the input and the high voltage; a serial connection between the high and low voltages of a second, third, and fourth MOS transistor; a connection between the gates of the first and second transistors and the junction of the third and fourth transistors; and a connection between the input and the gates of the third and fourth transistors.

10 Claims, 2 Drawing Sheets

CIRCUIT FOR PULLING AN INTEGRATED CIRCUIT INPUT TO A DETERMINED STATE

BACKGROUND OF THE INVENTION

1. Field of the Invention

The present invention relates to integrated circuits and more particularly to logic integrated circuits used in MOS technology.

2. Discussion of the Related Art

Integrated circuits may include numerous internal components and access pads, each of which may transmit and/or receive logic and/or analog signals. More particularly, input pads capable of receiving logic signals will be considered, although the same pads can also operate as output pads depending on whether an input amplifier or output amplifier is selected.

FIG. 1 schematically shows a conventional input pad 10 connected through a metallization 17 to an input of an amplifier 11 that is integral with an integrated circuit. Pad 10 receives external logic signals, that is, voltages at a predetermined high or low level. Additionally, each pad is generally associated with overvoltage protection components, for example, electrostatic discharges. These protection components are not represented for the sake of simplification.

Pad 10 is connected outside the integrated circuit through a conductor 12. As indicated above, conductor 12 is normally set to a high or low voltage. However, in many situations, conductor 12 is allowed to float. Then, there is a risk that input amplifier 11 may receive this floating voltage either as a low level or as a high level. Moreover, parasitic pulses or electrostatic discharges occurring on conductor 12 modify the pad voltage and will cause undesirable changes to the input of amplifier 11.

Thus, users of logic integrated circuits usually provide means for fixing the voltage of the logic inputs to a predetermined quiescent level when the input is floating. In the whole description, it is assumed that this predetermined quiescent level is the high level. However, of course, the invention can be readily adapted by those skilled in the art to the case when this predetermined quiescent level is the low level.

Conventionally, users of logic integrated circuits place outside the input circuit a so-called pull-up resistor, here resistor 13, between the input conductor 12 and voltage Vdd corresponding to the high level. Resistor 13 must have a sufficiently high value in order not to cause an excessive current consumption when conductor 12 is set to the low level and must have a sufficiently low value so that the time required for eliminating a parasitic pulse, when conductor 12 is in the floating state, is short enough. A commonly adopted trade-off value is approximately 50 kΩ; however, this trade-off value is not fully satisfactory.

Additionally, the provision of a pull-up resistor placed outside the integrated circuit complicates the connections that are to be made by the user of the integrated circuit.

SUMMARY OF THE INVENTION

A first object of the invention is to provide a circuit for pulling to a predetermined high or low quiescent level (hereinafter pulling-up) an input pad of a logic integrated circuit signal, that is part of the integrated circuit.

Another object of the invention is to provide such a pull-up circuit that has a high impedance when the level other than the predetermined quiescent level is applied to the input while having a fast time constant for achieving the quiescent level when the input is floating.

To achieve these objects, the invention provides a circuit for pulling to a second state an integrated circuit input capable of being in a first state corresponding to a first voltage (Vss), in a second state corresponding to a second voltage (Vdd), or in a floating state. The pull-up circuit includes a first MOS transistor with a channel of a first conductivity hype connected between the input and the second voltage, the serial connection between the second voltage and the first voltage of the channels of a second and a third MOS transistor of the first conductivity type, and of the channel of a fourth MOS transistor of a second conductivity type. A connection is formed between the gates of the first and second transistors and the junction of the channels of the third and fourth transistors, and a connection is formed between the input and the gates of the third and fourth transistors.

According to one aspect of the invention, the fourth transistor is designed so as to have a relatively high resistance value in the conductive state.

According to another aspect of the invention, the first, second and third transistors are P-channel MOS transistors, and the .fourth transistor is an N-channel MOS transistor, the first voltage being a low voltage (Vss) and the second voltage a high voltage (Vdd).

According to another aspect of the invention, the first and second transistors are identical.

The foregoing and other objects, features, aspects and advantages of the invention will become apparent from the following detailed description of the present invention when taken in conjunction with the accompanying drawings.

DETAILED DESCRIPTION

Figure 1:
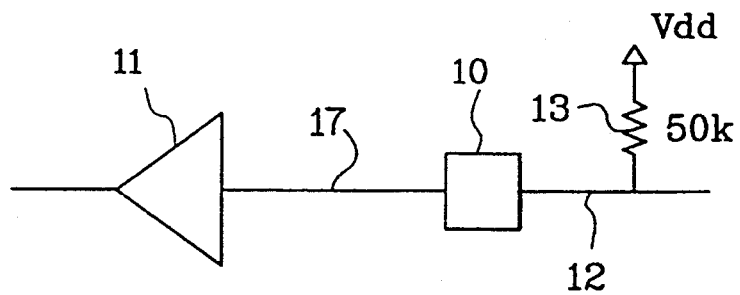
FIG. 1 shows an integrated circuit input pad associated with a pulling resistor according to the prior art.

Given the state of the art above described with reference to FIG. 1, users of integrated circuits have required the manufacturers of integrated circuits to provide the integration of a pull-up component such as resistor 13.

Figure 2:
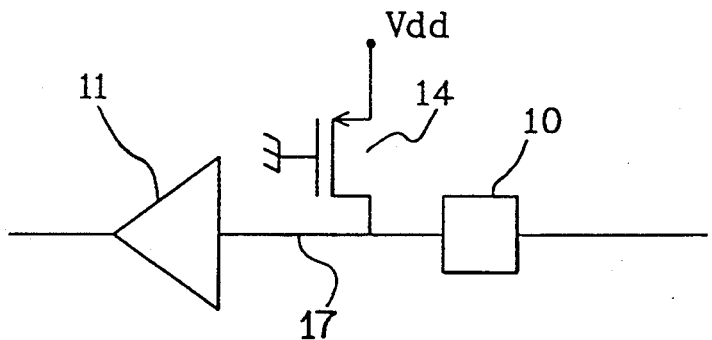
FIG. 2 shows an integrated pull-up component associated with an input pad.

A first idea which those skilled in the art of integrated circuits could have to achieve this object would be, as represented in FIG. 2, to connect the pad to the high supply voltage Vdd of the circuit through a P-channel MOS transistor 14 having its gate grounded. Indeed, it is usual in the field of integrated circuits to replace a resistor, whose fabrication requires a relatively large surface of silicon, by a MOS transistor. Additionally, those skilled in the art will choose the size of the MOS transistor, i.e., mainly the ratio W/L between the width and the length of the gate to obtain a resistor having a desired value. The length of the gate is the distance separating the source from the drain, and the width of the gate is the transverse dimension of the region between the source and drain.

Additionally, the replacement of a resistor by a MOS transistor lowers the current consumption.

Figure 3:
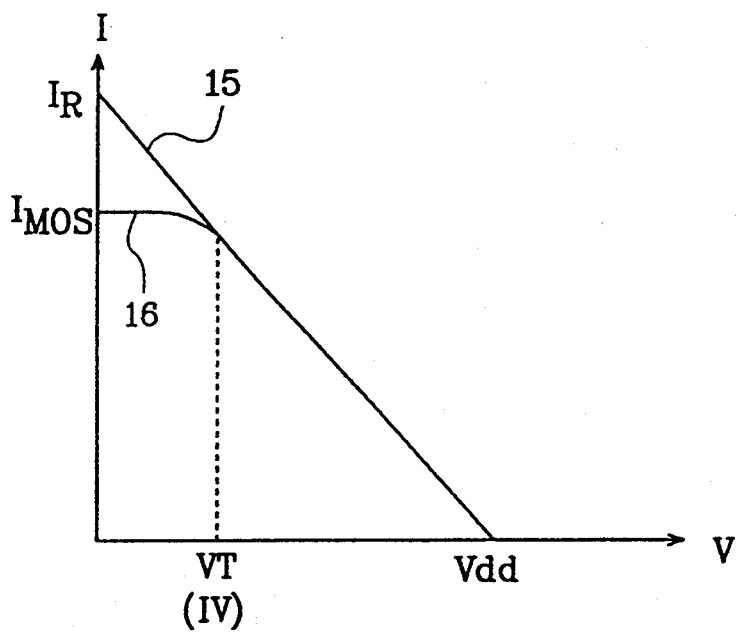
FIG. 3 shows the characteristic current-voltage curve of a circuit including the pull-up component of FIG. 1 or FIG. 2.

FIG. 3 shows on a single drawing the voltage-current curve of a resistor (curve 15) and of a MOS transistor (curve 16). Curve 15 shows a conventional linear characteristic of a resistor. When pad 10 is at voltage Vdd, the current is zero. When a low voltage, Vss, is imposed on pad 10, the consumption of current in the resistor is $I_R = Vdd/R$. However, if a MOS transistor is used, as soon as the voltage on the pad becomes lower than the threshold voltage VT (usually approximately 1 volt) of this MOS transistor, the current value saturates. Therefore, the current consumption is approximately 5 times lower when a MOS transistor is used if Vdd and Vss have the conventional values +5 volts and 0 volt. However, this requires a choice of the resistance value in the conductive state of the MOS transistor 14 to be substantially equal to the value that would be chosen for resistor 13; so, there is no significant decrease of current consumption.

Figure 4:
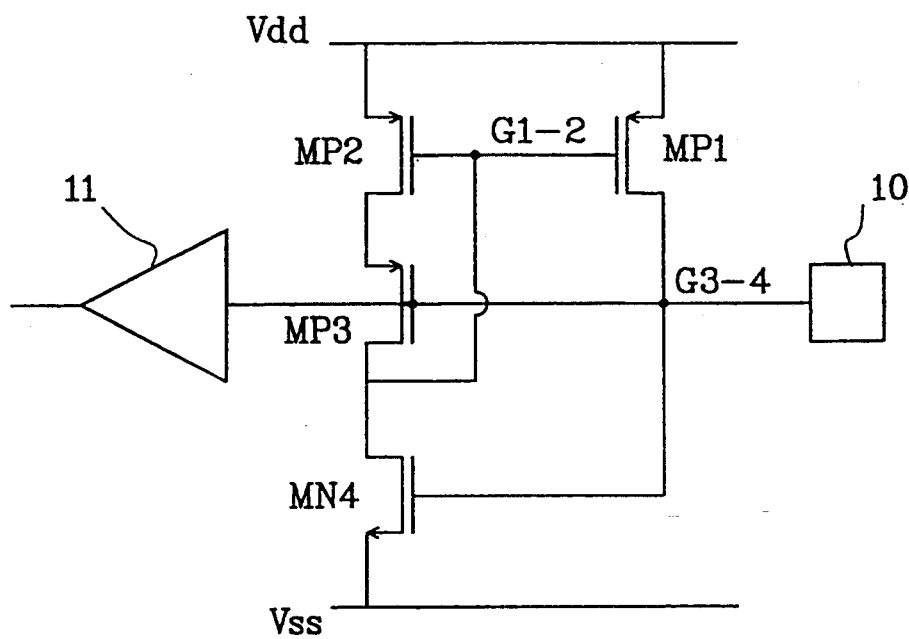
FIG. 4 shows a pull-up circuit according to the invention.

FIG. 4 schematically shows a circuit according to the invention that reduces the current consumption of the pull-up transistor when the pad is at a low voltage (Vss or 0 V).

According to the invention, pad 10 is connected to the high voltage terminal through a P-channel MOS transistor MP1. Additionally, the high voltage terminal Vdd (for example, 5 V) is connected to the low voltage terminal Vss (for example, 0 V) through the serial connection of two P-channel MOS transistors, MP2 and MP3, and of an N-channel MOS transistor, MN4. The gates of transistors MP2 and MP3 are interconnected and their junction G3-4 is connected to pad 10 and to the input of the input amplifier 11 of the integrated circuit.

In a manufacturing technology in which the P-channel MOS transistors are fabricated in N-type pockets formed in a P-type substrate, the pocket contact of each pocket is preferably connected to voltage Vdd.

The operation of the circuit of FIG. 4 will now be described for the various types of connection of pad 10.

Figure 5:
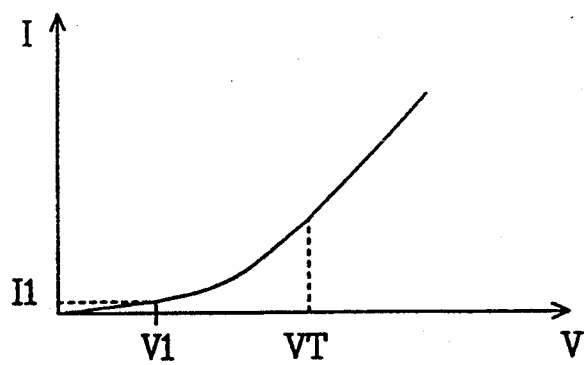
FIG. 5 shows a portion of a characteristic current-voltage curve of a pulling circuit according to the invention.

When pad 10 is connected, outside the integrated circuit, to a low voltage (Vss), transistor MN4 is cut off and transistor MP3 is conductive. Thus, transistor MP2 can be considered as having its gate connected to its drain, i.e., transistor MP2 behaves like a diode serially connected with transistor MN4; so, a very low current, for example, approximately 1 nA, flows through transistor MP2. Since transistor MP1 has its gate at the same voltage as transistor MP2, it will conduct a substantially identical current, i.e., transistor MP1 is in a very low inversion state, such as designated by values I1 and V1 in the portion of the characteristic curve of FIG. 5, where VT designates the threshold voltage of transistor MP1. This state is maintained as long as the voltage on pad 10 remains between Vss and Vss+VTMP2, where VTMP2 designates the threshold voltage of the MOS transistor MP2, usually approximately 0.8 V.

In accordance with the object of the invention, the current consumption in the state where the pad is at a low level is very low, approximately 1 nA, whereas the current consumption is approximately 0.1 mA (5 V/50 kΩ) in the prior art devices.

If, from the above state where pad 10 is set to low voltage, the voltage of the pad is allowed to remain floating, the low inversion current in transistor MP1 charges the gate capacitor of transistor MN4. When the voltage at the gate of transistor MN4 exceeds the threshold voltage of this transistor, the latter becomes conductive, thus reducing the gate voltage of transistor MP2 that also becomes conductive (transistor MP3 still remaining in the conductive state). Transistor MP1 that has the same gate voltage as transistor MP2 becomes also conductive, thus holding transistor MN4 in the conductive state. The voltage of pad 10 is then pulled-up to value Vdd through the conduction of transistor MP1. When the voltage at pad 10 and at the gate of transistor MP3 is increased up to a value Vdd−VTMP3, transistor MP3 switches to its cut off state. At this time, the gate G1-2 of transistor MP1 is at voltage Vss because of the conductive state of transistor MN4. The conductive state of transistor MP1 is therefore held and the latter is in a conductive state with a low dynamic resistance corresponding to the resistance at the conductive state of a P-channel MOS transistor, conventionally ranging from 5 to 10 kΩ. Due to this low impedance value, pad 10 is very efficiently protected against parasitic pulses that will be eliminated with a short time constant.

If pad 10 goes from its floating state to a state where its voltage is fixed to 5 V, the same state as reached above is maintained, the consumption of current still being practically zero.

When pad 10 is pulled-down again to Vss, the first above described state is restored, transistor MN4 rapidly going from the conductive state to the blocked state.

A circuit embodying the invention has been fabricated. This circuit allows easy manufacturing in the form of an integrated circuit, has a low impedance which increases the capability of eliminating parasitic pulses when the input is floating, and has a practically zero current consumption when pad 10 is in a state other than the quiescent state.

Figure 6:
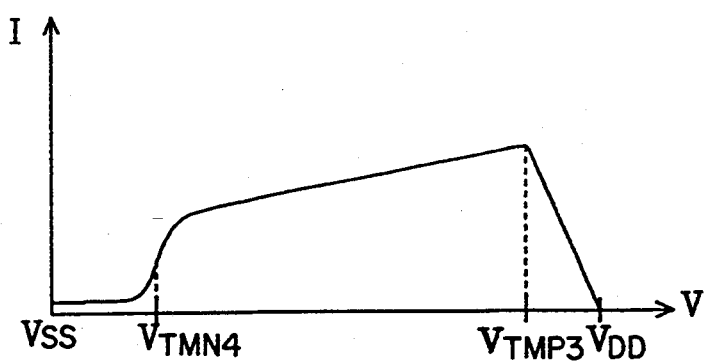
FIG. 6 shows a characteristic current-voltage curve of a pull-up circuit according to the invention.

FIG. 6 shows the current-voltage characteristic curve of the pull-up/pull-down circuit according to the invention. The only phases when the circuit consumes current are the transition phases between the state where the input is at a low level and the state where the input becomes floating, as well as between the high and low states of the input. Then, a short phase occurs, mainly between voltages VTMN4 and VTMP3 where transistors MP2, MP3 and MN4 are conductive. Those skilled in the art will be able to choose the geometry of transistor MN4 in order to limit this transient current. By way of example, one can choose for transistors MP1 and MP2, a ratio W/L=10/5; for transistor MP3, acting as a switch, a ratio W/L=3/2; and for transistor MN4, complying with a current limitation characteristic, a ratio W/L=3/25. The above values can be, in an embodiment, expressed in micrometers.

In the above description, transistors MP1 and MP2 are presented as being identical. Depending on required specific characteristics, those skilled in the art will be able to choose distinct geometric ratios for these transistors.

Additionally, as indicated in the preamble of the above description, a circuit embodying the invention may also be used for pulling-down a pad. Then, the role of sources Vdd and Vss is to be reversed, as well as all the types of the described MOS transistors.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A circuit having an output connected to an integrated circuit input, the circuit for pulling to a second voltage the integrated circuit input which is capable of receiving a first voltage, receiving a second voltage and floating at an indefinite voltage, the circuit including:
a first MOS transistor with a channel of a first conductivity type connected between said input and a source of the second voltage; and
a second and third MOS transistor, each with a channel of the first conductivity type and a fourth MOS transistor having a channel of a second conductivity type, the channels connected in series, in the order recited, between a source of the second voltage and the source of the first voltage;
a connection formed between a gate of the first transistor, a gate of the second transistor and a junction of the channel of the third transistor and the channel of the fourth transistor; and
a connection formed between said input, the gate of the third transistor and the gate of the fourth transistor.

2. The circuit of claim 1, wherein the fourth transistor has a high resistance in a conductive state, relative to resistances in a conductive state of the first, second and third transistors.

3. The circuit of claim 1, wherein the first, second and third transistors are P-channel MOS transistors, and the fourth transistor is an N-channel MOS transistor, the first voltage being a low voltage and the second voltage a high voltage.

4. The circuit of claim 1, wherein the first and second transistors have identical geometries.

5. A circuit for receiving an input which may be connected to one of a first voltage, a second voltage and an open circuit, the circuit further for pulling the input to the second voltage when connected to the open circuit, the circuit comprising:
means having a control input for selectively connecting the input to a source of the second voltage;
first means connected to the control input for controlling the means for selectively connecting so as to connect the input to the source of the second voltage when the received input is the open circuit; and
second means connected to the control input for controlling the means for selectively connecting so as to disconnect the input from the source of the second voltage when the received input is the first voltage.

6. The circuit of claim 5, wherein the means for selectively connecting permits a leakage current to flow, changing a voltage on a capacitance of the input when disconnecting the input from the source of the second voltage, and wherein the first means for controlling further comprises:
means for detecting a change of the voltage on the capacitance of the input; and
means responsive to the means for detecting for producing as an output a signal applied to the control input so as to cause the means for selectively connecting to connect the input to the source of the second voltage.

7. A method of controlling a pull-up transistor connected between an integrated circuit input terminal and a source of a first voltage, the input terminal for receiving one of a first input voltage, a second input voltage and an open circuit, the method permitting only a low input current consumption when the input terminal receives the second input voltage, comprising the steps of:
applying a voltage present at the input terminal to a control circuit;
producing a control signal in the control circuit responsive to the voltage applied thereto, the control signal suitable for placing the pull-up transistor in a cut-off state when the voltage applied thereto is the second input voltage; and
applying the control signal to the pull-up transistor.

8. A method of controlling a pull-up transistor connected between an integrated circuit input and a first supply voltage so as to pull the input to the first supply voltage when the input is permitted to float, the method comprising the steps of:
permitting a leakage current to flow from a source within the integrated circuit into a capacitance of the integrated circuit input, producing a voltage thereat;
providing the voltage from the integrated circuit input to a control circuit;
producing a control signal in the control circuit responsive to the voltage provided thereto, for turning on the pull-up transistor when the voltage provided from the integrated circuit input reaches a predetermined value; and
applying the control signal to the pull-up transistor.

9. The method of claim 8, wherein the step of permitting a leakage current to flow further comprises the step of:
providing the leakage current through the pull-up transistor.

10. A circuit for receiving an input which may be connected to one of a first voltage, a second voltage and an open circuit, the circuit further for pulling the input to the second voltage when connected to the open circuit, the circuit comprising:
means having a control input for selectively connecting the input to a source of the second voltage;
first means connected to the control input for controlling the means for selectively connecting so as to connect the input to the source of the second voltage when the received input is the open circuit; and
second means connected to the control input for controlling the means for selectively connecting so as to disconnect the input from the source of the second voltage when the received input is the first voltage; and wherein
the means for selectively connecting permits a leakage current to flow, changing a voltage on a capacitance of the input when disconnecting the input from the source of the second voltage, and wherein the first means for controlling further comprises
means for detecting a change of the voltage on the capacitance of the input; and
means responsive to the means for detecting for producing as an output a signal applied to the control input so as to cause the means for selectively connecting to connect the input to the source of the second voltage.

* * * * *